(12) United States Patent
Jacobson et al.

(10) Patent No.: US 7,372,701 B2
(45) Date of Patent: May 13, 2008

(54) CANTILEVER MOUNTED ELECTRONIC MODULE WITH RIGID CENTER BACKBONE

(75) Inventors: Jon Thomas Jacobson, Fargo, ND (US); David Scott Gordon, Hillsboro, ND (US); Jason Robert Weishaar, West Fargo, ND (US); Michael Andrew Hajicek, West Fargo, ND (US); Michael Ray Schlichtmann, Fargo, ND (US)

(73) Assignee: Deere & Company, Moline, IL (US)

( * ) Notice: Subject to any disclaimer, the term of this patent is extended or adjusted under 35 U.S.C. 154(b) by 126 days.

(21) Appl. No.: 11/494,158

(22) Filed: Jul. 27, 2006

(65) Prior Publication Data

US 2008/0024996 A1    Jan. 31, 2008

(51) Int. Cl.
*H05K 5/06* (2006.01)
*H05K 7/20* (2006.01)

(52) U.S. Cl. ............... 361/714; 361/715; 361/721; 361/728; 361/736; 165/80.3; 165/185; 174/16.3; 174/50; 174/50.5; 439/34; 439/76.2; 439/949

(58) Field of Classification Search ............... 361/704, 361/707, 715, 721, 728, 736, 710–714, 641–648; 174/50, 50.51, 52, 52.5, 50.53, 68.2, 68.3, 174/76.2, 87, 254, 250, 252, 71 B, 72 B, 174/77 R, 48, 52.3, 57, 65 R; 220/3.2–3.8; 29/830, 832, 835, 836, 839, 840; 439/67, 439/76.2, 34, 26.1, 493, 949; 165/80.3, 185
See application file for complete search history.

(56) References Cited

U.S. PATENT DOCUMENTS

| 4,861,282 | A | * | 8/1989 | Kobayashi et al. ...... 439/540.1 |
| 4,916,575 | A | * | 4/1990 | Van Asten .................. 361/715 |
| 4,954,085 | A | * | 9/1990 | Inoue et al. .................. 439/34 |
| 5,785,532 | A | * | 7/1998 | Maue et al. .................. 439/34 |
| 6,166,909 | A | * | 12/2000 | Sumida ...................... 361/704 |
| 6,350,949 | B1 | * | 2/2002 | Boyd ........................ 174/50.5 |
| 6,377,462 | B1 | | 4/2002 | Hajicek et al. |
| 6,655,017 | B1 | | 12/2003 | Formwalt, Jr. et al. |
| 6,807,060 | B2 | * | 10/2004 | Glovatsky et al. .......... 361/707 |
| 2007/0146973 | A1 | * | 6/2007 | Leiber ........................ 361/641 |

* cited by examiner

*Primary Examiner*—Michael Datskovskiy

(57) ABSTRACT

A work machine includes a bulkhead separating an operator cab from an engine compartment. An electronic module includes a cantilever arranged mounting flange mounted to the bulkhead. The electronic module includes a rigid and thermally conductive frame. An electronics board is mounted to one side of the frame, and a power board is mounted to an opposite side of the frame. The electronics board carries a plurality of electronic components, and the power board carries a plurality of replaceable power elements. Each power element is a fuse, relay and/or circuit breaker. A housing encloses the electronics board and the power board. The housing includes an access cover to the power board.

26 Claims, 3 Drawing Sheets

CANTILEVER MOUNTED ELECTRONIC MODULE WITH RIGID CENTER BACKBONE

FIELD OF THE INVENTION

The present invention relates to electronic assemblies used in harsh operating environments, and, more particularly, to enclosed and cantilever arranged electronic assemblies used in such environments.

BACKGROUND OF THE INVENTION

Work vehicles, such as agricultural or industrial tractors, have an increasing number of electronic components and power distribution requirements. The power and data distribution occurs in a relatively harsh operating environment with moisture, vibration and heat transfer concerns. Typically, it is necessary to route electrical harnesses from devices (such as operator controls and displays) inside the vehicle cab through the vehicle bulkhead into the engine compartment, where many of the vehicle's electronic controllers are mounted. This "pass through" of data and power between the cab and engine compartment must be environmentally sealed to water and dust. A bulkhead mounted electronic module typically includes a mounting flange at one end thereof which fits into and hermetically seals with a hole in the bulkhead of the vehicle. The mounting flange is positioned at the end of the electronic module so that a small footprint is utilized at the connection location. The electronic module has a "cab side" and an "engine side" on opposite sides of the mounting flange, with plug-in electrical connectors specific to each side.

With a flange mounted electronic module as described above, only the plug-in connector(s) are exposed on the cab side of the bulkhead, and the electronic module is arranged in a cantilever manner on the engine side of the bulkhead. This works well for an electronic module with a sturdy metal "shell" or housing surrounding and enclosing the electronics inside. The metal housing provides enough rigidity to support the cantilevered electronic module and minimize vibration concerns.

An electronic module in the form of a power distribution module may also be flange mounted to the vehicle bulkhead. The power distribution module is essentially a "fuse panel" for the vehicle, containing fuses and relays used by the vehicle functions in both the cab and the engine compartment. A power distribution module passing through the bulkhead and cantilever arranged in the engine compartment provides access to both sides of the module, allowing access to harness connectors on one side, and the fuses and relays on the other side. However, because access must be provided to the fuses and relays so that they can be replaced as needed, a metal housing completely enclosing the module is not possible. The housing thus includes an access cover providing access to the fuses and relays on one side of the power distribution module.

With a cantilever mounted power distribution module as described above, vibrations can be a concern. Moreover, removal and insertion of the fuses and/or relays puts mechanical stresses on the printed circuit board (PCB) within the housing which carries the fuses and relays. These mechanical stresses can damage electrical traces and components on the PCB. Further, many of the electronic components used in power distribution can generate a substantial amount of heat which must be drawn away from the electronic components.

What is needed in the art is an electronic module which may be flange mounted to a bulkhead of a vehicle in a manner to alleviate moisture, vibration and heat transfer concerns, and provide a high level of reliability.

SUMMARY OF THE INVENTION

The invention comprises, in one form thereof, a work machine including a bulkhead separating an operator cab from an engine compartment. An electronic module includes a cantilever arranged mounting flange mounted to the bulkhead. The electronic module includes a rigid and thermally conductive frame. An electronics board is mounted to one side of the frame, and a power board is mounted to an opposite side of the frame. The electronics board carries a plurality of electronic components, and the power board carries a plurality of replaceable power elements. Each power element is a fuse, relay and/or relay circuit breaker. A housing encloses the electronics board and the power board. The housing includes an access cover to the power board.

The invention comprises, in another form thereof, an electronic module including a cantilever arranged mounting flange for mounting to a bulkhead of a work vehicle. The electronic module includes a rigid and thermally conductive frame. An electronics board mounted to one side of the frame carries a plurality of electronic components. A power board mounted to an opposite side of the frame carries a plurality of replaceable power elements, with each power element being a fuse, relay and/or circuit breaker. A housing encloses the electronics board and the power board. The housing includes an access cover to the power board.

DETAILED DESCRIPTION OF THE INVENTION

Figure 1:
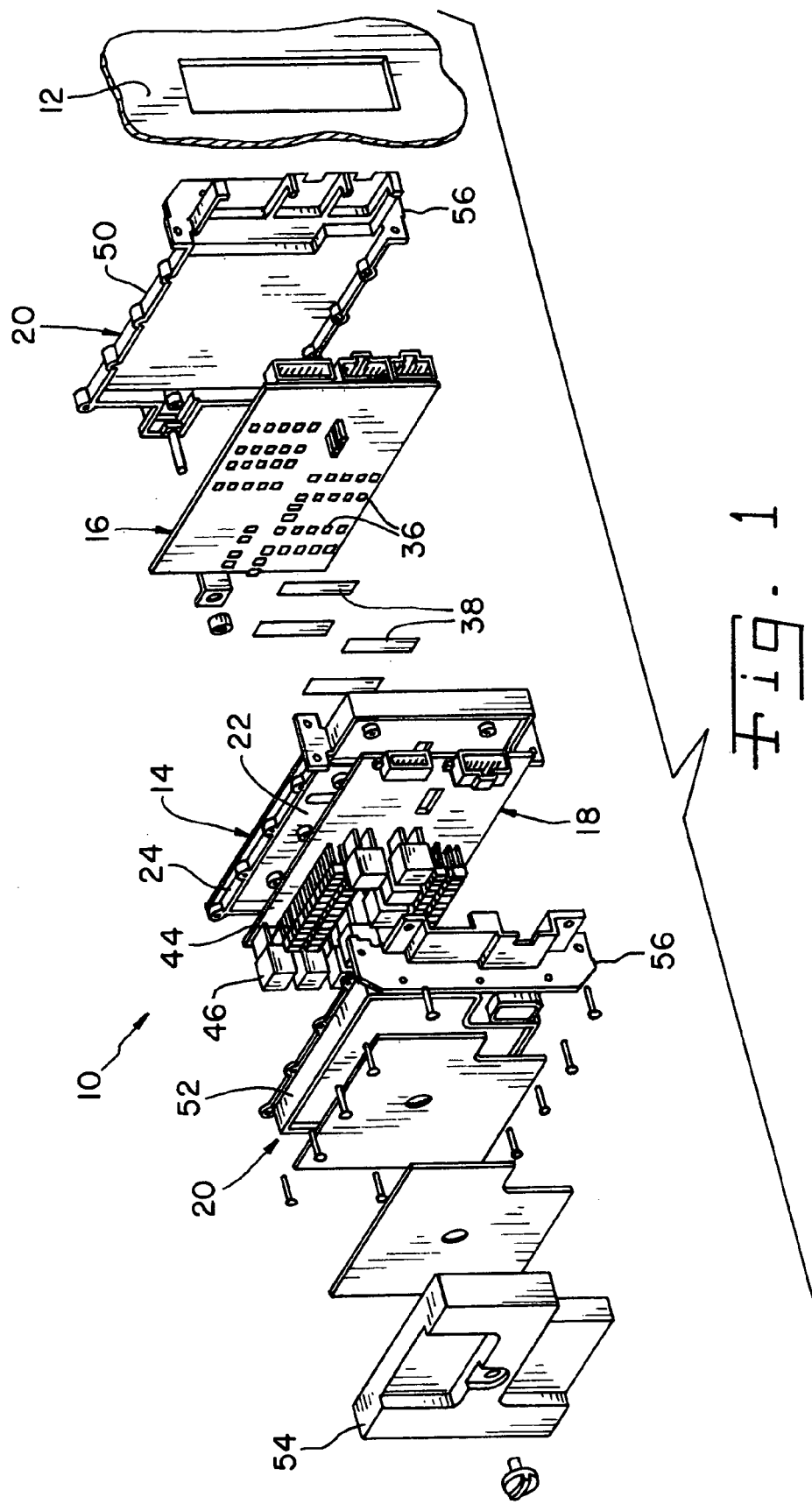
FIG. 1 is an exploded, perspective view of an embodiment of an electronic module of the present invention.

Referring now to the drawings, there is shown an embodiment of an electronic module 10 which may be mounted to a bulkhead 12 of a vehicle, such as an agricultural or industrial tractor. Bulkhead 12 separates an operator cab from the engine compartment of the vehicle, as described above. In the embodiment shown, electronic module 10 is in the form of a power distribution module which is mounted to bulkhead 12, but could be in the form of a different type of electronic module mounted to bulkhead 12.

Electronic module 10 generally includes a rigid and thermally conductive frame 14 (also referred to herein as a "rigid backbone"), an electronics board 16, a power board 18, and a housing 20. Frame 14 is a metal frame providing structural rigidity to electronic module 10. Frame 14 includes a center panel 22 and surrounding transverse peripheral edge 24. Peripheral edge 24 provides mechanical strength to and reduces vibrations of frame 14. Center panel 22 includes one or more cutouts 26 allowing electrical coupling between electronics board 16 and power board 18, as will be described below. By constructing frame 14 from metal, electromagnetic radiation is also reduced between electronics board 16 and power board 18.

In the embodiment shown, frame 14 is constructed as a metal frame providing substantial rigidity, thermal conductivity and electromagnetic radiation shielding. However, it may also be possible to construct frame 14 from a different type of material providing these desirable physical attributes, such as a thermally conductive composite material.

Figure 2:
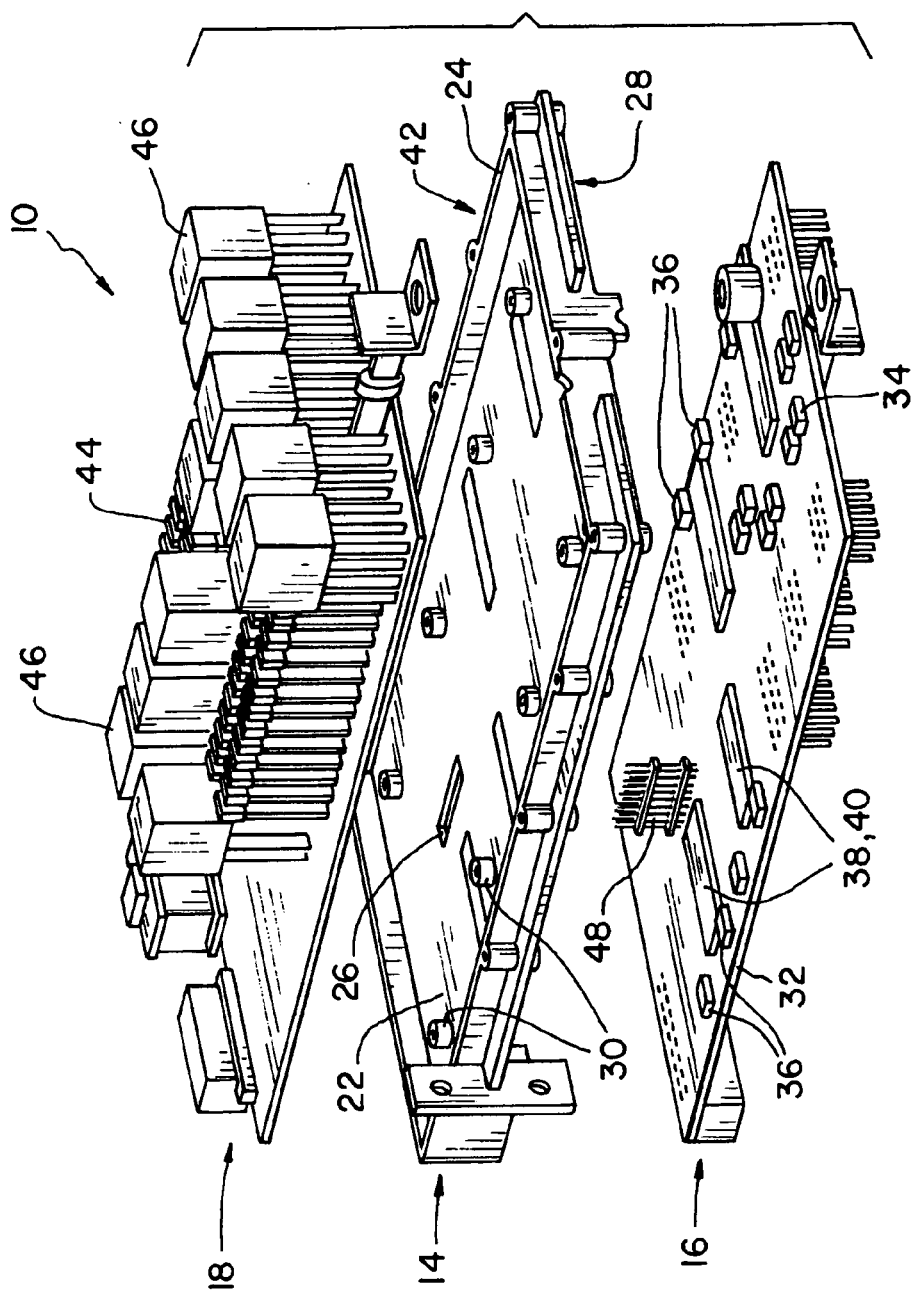
FIG. 2 is an exploded, perspective view of the frame, electronics board and power board shown in FIG. 1.
Figure 3:
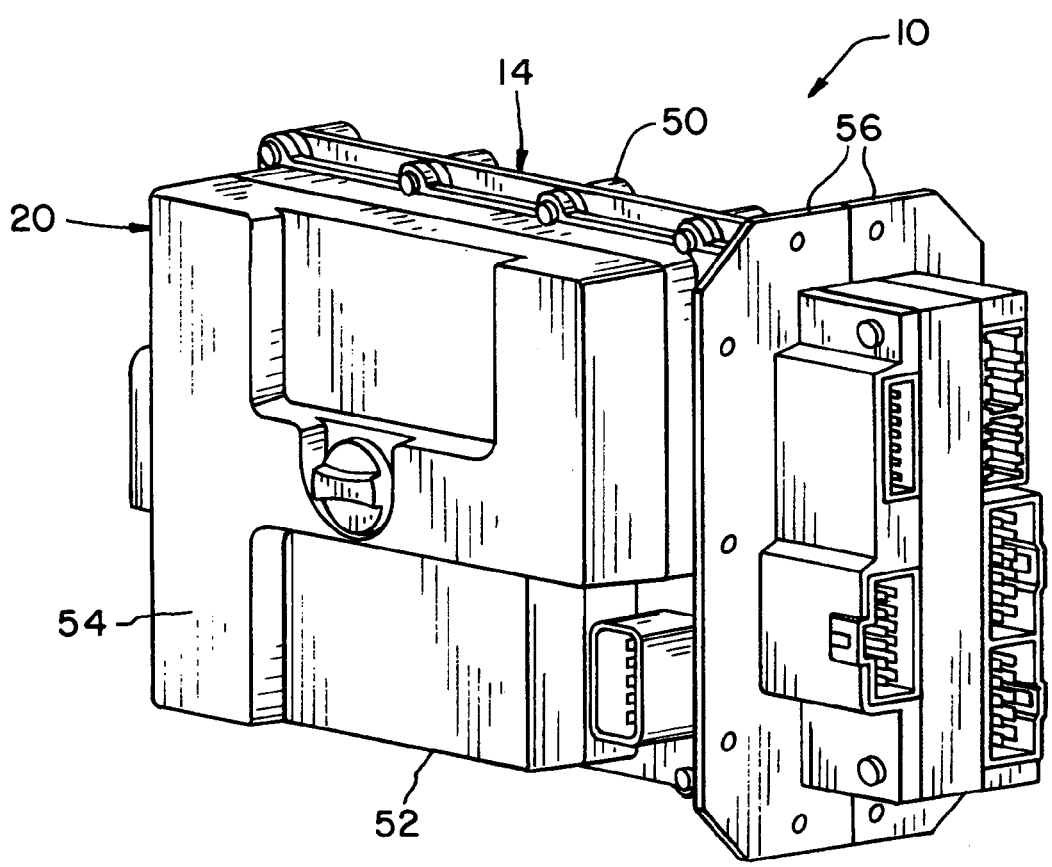
FIG. 3 is a perspective view of the electronic module illustrated in FIG. 1, shown assembled and mounted to a portion of a bulkhead.

Electronics board 16 is mounted to one side 28 of frame 14 using one or more stand-offs 30. Electronics board 16 includes a PCB 32 carrying a plurality of electronic components 34. For example, electronic module 10 typically includes a number of field effect transistors (also known as FETs) 36 which can generate a substantial amount of heat. It is desirable to transfer this generated heat to frame 14, where it can be dissipated and transferred to the ambient environment. To that end, a number of thermally conductive dielectric members 38 in the form of silicone pads (also known as sil-pads) thermally couple electronics board 16 with frame 14. Heat sink plates 40 directly contact FETs 36 and are interposed between respective FETs 36 and sil-pads 38. (Sil-pads 38 and heat sink plates 40 are the same size and stacked together in FIG. 2 and therefore appear as a unitary piece.) In the embodiment shown, heat sink plates 40 are metal and both thermally and electrically conductive. Heat is transferred from FETs 36, through heat sink plates 40 and sil-pads 38, to frame 14. Sil-pads 38 do not allow the conductivity of electrical current to frame 14.

Power board 18 is mounted to a side 42 of frame 14 which is opposite from electronics board 16. Power board 18 carries a plurality of replaceable power elements in the form of fuses 44, relays 46 and/or circuit breakers (not specifically shown). Fuses 44 and relays 46 may periodically fail, and thus must be accessed for replacement. Power board 18 includes a suitable connector (not specifically shown), such as a single inline package (SIP) or dual inline package (DIP), which connects with pins 48 extending from electronics board 16 and passing through a respective cutout 26 in center panel 22 of frame 14.

Housing 20 encloses electronics board 16 and power board 18. More particularly, housing 20 includes a first housing half 50 covering electronics board 16 and mounted to side 28 of frame 14, and a second housing half 52 covering power board 18 and mounted to opposite side 42 of frame 14. First housing half 50 and second housing half 52 each hermetically seal with peripheral edge 24 of frame 14 to in turn hermetically seal electronics board 16 and power board 18. Second housing half 52 includes an access cover 54 providing access to fuses 44 and/or relays 46 on power board 18. Access cover 54 likewise is hermetically sealed with second housing half 52. To reduce the piece price and tooling costs, first housing half 50 and second housing half 52 are preferably each made from plastic, but could be made from a different type of material such as a metal or composite material, depending upon the application.

First housing half 50 and second housing half 52 each include a portion of and conjunctively define a transversely extending flange 56 which is coupled and hermetically seals with bulkhead 12 of the vehicle. Flange 56 is preferably located at an end of electronic module 10 to reduce the footprint of the mounting location with bulkhead 12. It is also possible to form electronic module 10 such that frame 14 also forms a part of the mounting flange 56. For example, frame 14 can be formed with a portion of the mounting flange which is sandwiched between flanges 56 of first housing half 50 and second housing half 52.

Having described the preferred embodiment, it will become apparent that various modifications can be made without departing from the scope of the invention as defined in the accompanying claims.

The invention claimed is:

1. A work machine, comprising:
   a bulkhead separating an operator cab from an engine compartment; and
   an electronic module including a cantilever arranged mounting flange mounted to said bulkhead, said electronic module comprising:
   a rigid and thermally conductive frame;
   an electronics board mounted to one side of said frame, said electronics board carrying a plurality of electronic components;
   a power board mounted to an opposite side of said frame, said power board carrying a plurality of replaceable power elements, each said power element comprising one of a fuse, a relay and a circuit breaker; and
   a housing enclosing said electronics board and said power board, said housing including an access cover to said power board.

2. The work machine of claim 1, wherein said frame is a metal frame.

3. The work machine of claim 2, wherein said frame is configured to provide a barrier for electromagnetic radiation between said electronics board and said power board.

4. The work machine of claim 1, wherein said frame includes a center panel and surrounding transverse peripheral edge.

5. The work machine of claim 1, wherein said frame includes at least one cutout allowing electrical coupling between said power board and said electronics board.

6. The work machine of claim 1, wherein said housing includes a first housing half covering said electronics board and mounted to said one side of said frame, and a second housing half covering said power board and mounted to said opposite side of said frame, said second housing half including said access cover.

7. The work machine of claim 6, wherein each of said first housing half and said second housing half are comprised of plastic.

8. The work machine of claim 1, wherein said housing includes said mounting flange.

9. The work machine of claim 1, including a thermally conductive dielectric member which thermally couples said electronics board with said frame.

10. The work machine of claim 9, wherein said electronic components include a field effect transistor, said dielectric member thermally coupling said field effect transistor with said frame.

11. The work machine of claim 10, including a heat sink plate interposed between said field effect transistor and said dielectric member.

12. The work machine of claim 9, wherein said dielectric member comprises a silicone pad.

13. The work machine of claim 1, wherein said electronic module comprises a power distribution module.

14. An electronic module including a cantilever arranged mounting flange for mounting to a bulkhead, said electronic module comprising:
   a rigid and thermally conductive frame;
   an electronics board mounted to one side of said frame, said electronics board carrying a plurality of electronic components;

a power board mounted to an opposite side of said frame, said power board carrying a plurality of replaceable power elements, each said power element comprising one of a fuse, a relay and a circuit breaker; and a housing enclosing said electronics board and said power board, said housing including an access cover to said power board.

15. The electronic module of claim 14, wherein said frame is a metal frame.

16. The electronic module of claim 15, wherein said frame is configured to provide a barrier for electromagnetic radiation between said electronics board and said power board.

17. The electronic module of claim 14, wherein said frame includes a center panel and surrounding transverse peripheral edge.

18. The electronic module of claim 14, wherein said frame includes at least one cutout allowing electrical coupling between said power board and said electronics board.

19. The electronic module of claim 14, wherein said housing includes a first housing half covering said electronics board and mounted to said one side of said frame, and a second housing half covering said power board and mounted to said opposite side of said frame, said second housing half including said access cover.

20. The electronic module of claim 19, wherein each of said first housing half and said second housing half are comprised of plastic.

21. The electronic module of claim 14, wherein said housing includes said mounting flange.

22. The electronic module of claim 14, including a thermally conductive dielectric member which thermally couples said electronics board with said frame.

23. The electronic module of claim 22, wherein said electronic components include a field effect transistor, said dielectric member thermally coupling said field effect transistor with said frame.

24. The electronic module of claim 23, including a heat sink plate interposed between said field effect transistor and said dielectric member.

25. The electronic module of claim 22, wherein said dielectric member comprises a silicone pad.

26. The electronic module of claim 14, wherein said electronic module comprises a power distribution module.

* * * * *